(12) United States Patent
Schneider et al.

(10) Patent No.: US 8,129,217 B2
(45) Date of Patent: Mar. 6, 2012

(54) METHOD FOR PRODUCING AT LEAST ONE MULTILAYER BODY, AND MULTILAYER BODY

(75) Inventors: Gernot Schneider, Baar (CH); Rene Staub, Hagendorn (CH); Wayne Robert Tompkin, Baden (CH); Achim Hansen, Zug (CH)

(73) Assignee: OVD Kinegram AG, Zug (CH)

( * ) Notice: Subject to any disclaimer, the term of this patent is extended or adjusted under 35 U.S.C. 154(b) by 502 days.

(21) Appl. No.: 12/309,908

(22) PCT Filed: Aug. 3, 2007

(86) PCT No.: PCT/EP2007/006884
§ 371 (c)(1),
(2), (4) Date: Mar. 6, 2009

(87) PCT Pub. No.: WO2008/017426
PCT Pub. Date: Feb. 14, 2008

(65) Prior Publication Data
US 2009/0289246 A1    Nov. 26, 2009

(30) Foreign Application Priority Data

Aug. 9, 2006 (DE) .......................... 10 2006 037 433

(51) Int. Cl.
*H01L 51/40* (2006.01)
*H01L 21/302* (2006.01)
*H01L 21/461* (2006.01)

(52) U.S. Cl. .......... 438/99; 438/708; 438/717; 438/725; 430/312; 257/E51.001

(58) Field of Classification Search .................... 438/99, 438/708, 717, 725; 430/312; 257/40, E51.001
See application file for complete search history.

(56) References Cited

U.S. PATENT DOCUMENTS 3,829,213 A    8/1974    Payne
(Continued)

FOREIGN PATENT DOCUMENTS

| DE | 102004059467 | 7/2006 |
|----|--------------|--------|
| EP | 1624338 | 2/2006 |
| WO | WO 01/40836 | 6/2001 |
| WO | WO 2004/079833 | 9/2004 |

OTHER PUBLICATIONS

Hubler, Arved, "Printing Technologies for Polytronic Structures," 1$^{st}$ Polyscience Workshop at IMEC in Leuven, Belgium (Jun. 14, 2002).

(Continued)

*Primary Examiner* — David S Blum
(74) *Attorney, Agent, or Firm* — Hoffman & Baron, LLP

(57) ABSTRACT

The invention concerns a process for the production of a multi-layer body, wherein the multi-layer body includes at least two functional layers on a top side of a carrier substrate, which are structured in register relationship with each other, by a procedure whereby an underside of the carrier substrate is prepared in such a way that in a first region there results a transparency for a first exposure radiation and in at least one second region there results a transparency for at least one second exposure radiation different therefrom in register relationship with the first region, the underside is successively exposed with the first and the at least one second exposure radiation and the first exposure radiation is used for structuring a first functional layer and the at least one second exposure radiation is used for structuring at least one second functional layer on the top side of the carrier substrate.

38 Claims, 6 Drawing Sheets

U.S. PATENT DOCUMENTS

| | | | |
|---|---|---|---|
| 4,374,911 A * | 2/1983 | Hartley | 430/5 |
| 5,932,397 A | 8/1999 | Mustacich | |
| 6,133,933 A | 10/2000 | Paoli | |
| 6,255,130 B1 * | 7/2001 | Kim | 438/30 |
| 6,569,580 B2 * | 5/2003 | Campi et al. | 430/5 |
| 2002/0195928 A1 | 12/2002 | Grace et al. | |
| 2004/0009413 A1 | 1/2004 | Lizotte et al. | |
| 2008/0197343 A1 | 8/2008 | Blache et al. | |
| 2009/0130397 A1 * | 5/2009 | Irving et al. | 428/195.1 |

OTHER PUBLICATIONS

Degussa, "Elements," Science Newsletter 13 (2005).

"Glossary, Begriffe und Terminilogien von Leiterplatten," (Date Unknown).

* cited by examiner

METHOD FOR PRODUCING AT LEAST ONE MULTILAYER BODY, AND MULTILAYER BODY

This application claims priority based on an International Application filed under the Patent Cooperation Treaty, PCT/EP2007/006884, filed on Aug. 3, 2007 and German Application No. DE 102006037433.9-33, filed on Aug. 9, 2006.

BACKGROUND OF THE INVENTION

The invention concerns a process for the production of a multi-layer body, in particular a multi-layer body having at least one electronic component, wherein the multi-layer body includes at least two functional layers, in particular electrical functional layers, on a top side of a carrier substrate, which are structured in register relationship with each other. The invention further concerns a multi-layer body which can be obtained therewith.

DE 10 2004 059 467 A1 describes electronic components in the form of organic field effect transistors (OFET) which are connected to afford a logic gate, as well as the production thereof on a carrier substrate. The field effect transistors are made up from a plurality of function layers or functional layers which are applied to the carrier substrate in particular by printing or application with a doctor. The carrier substrate is inter alia in the form of a plastic film of a thickness in the range of between 6 and 200 μm.

In that respect thick carrier substrates were long preferred as, when processing thin, less expensive carrier substrates of a thickness in the range of between about 6 and about 50 μm, it was found that they have a tendency to distortion during the processing operation, with the distortion changing with each processing step. When an electrical functional layer is applied to and structured on the thin carrier substrate, that already involves noticeable distortion or, viewed perpendicularly to the carrier substrate, a departure in the shape of the functional layer from the ideal form thereof. The distortion has a particularly disturbing effect if subsequently or after the application of one or more functional layers over the full surface area involved, combined with a further change in the dimensions of the structured functional layer which has already been formed, a further structured functional layer has to be arranged in register relationship with the structured functional layer which has already been formed.

SUMMARY OF THE INVENTION

Therefore the object of the invention is to provide an improved process for the production of a multi-layer body with functional layers structured in register relationship with each other, and components which can be produced in accordance therewith, and in particular to provide an improved process for the production of electronic components on carrier substrates which have a tendency to distort.

For the process for the production of a multi-layer body which includes at least two in particular electrical functional layers on a top side of a carrier substrate, which are structured in register relationship with each other, that object is attained in that an underside of the carrier substrate is prepared in such a way that in a first region the result is a transparency for a first exposure radiation and in at least one second region the result is a transparency for at least one second exposure radiation which is different in relation thereto in register relationship with the first region, the underside is successively exposed with the first and the at least one second exposure radiation and the first exposure radiation is used for structuring a first functional layer and the at least one second exposure radiation is used for structuring at least one second functional layer on the top side of the carrier substrate.

The process according to the invention, in spite of a distortion of the carrier substrate in the processing thereof, permits an arrangement without any problem of the at least one second functional layer in perfect or almost perfect register relationship with the first functional layer as the distortion which occurs equally affects the first region and the at least one second region. The form of the first region, viewed perpendicularly to the plane of the carrier substrate, is changed by the distortion in conformity with the form of the at least one second region so that the position of the first region cannot be displaced with respect to the position of the at least one second region. The position of the first region and of the at least one second region is thus already established at the beginning of the production process, on the carrier substrate, so that inaccuracy in terms of the orientation of the first functional layer in relation to the at least one second functional layer can no longer occur, in spite of a distortion of the carrier substrate. The at least one second functional layer is produced in a form which departs from its ideal form and in a form adapted to the currently prevailing form of the first functional layer, in an accurate positional relationship with the first functional layer. By virtue of the precise positioning of the functional layers relative to each other, it is now possible to produce high-grade optical and/or electrical components having improved optical or electrical properties respectively, while at the same time requiring a smaller amount of space on the carrier substrate.

Thus, in the production of OFETs on a thin carrier substrate, markedly lower gate capacitances are achieved by virtue of the optimum orientation of the source/drain electrodes in relation to the gate electrode so that a switching speed of the OFETs is markedly increased. While, in the earlier production methods, about 80% of the surface area of the carrier substrate was lost for taking into consideration tolerances in the production of the individual functional layers, markedly better utilization of the surface area of the carrier substrate is now possible so that around up to 100% more electronic components can be formed on a carrier substrate.

The process according to the invention further presents itself in particular for the production of optical components including two structured functional layers which are separated from each other by a spacer layer. In that case the two structured functional layers can be metallic or colored layers. Preferably the first functional layer is an opaque mask layer which, when viewed, causes angle-dependent geometrical shadowing of the second structured functional layer and thus, depending on the respective viewing angle involved, produces for example a color flip or a change in the illustrated image information. In this case also it is possible for the two or more functional layers which can be structured independently of each other to be placed directly one upon the other and thus for example to form a color image by additive or subtractive color mixing. The functional layers can further involve IR- or UV-luminescent layers which can be structured independently of each other or layers provided with optical variable pigments (thin film layer pigments, liquid crystal pigments). Furthermore it is also possible for the optical functional layer to be further also superposed by a diffractive surface relief and thus for example to represent metallic or dielectric reflection layers permitting the generation of a partially present optically variable effect (for example a hologram).

It can be provided that the carrier substrate is provided on the underside directly with relief structures or a layer applied to the underside, in particular comprising a thermoplastic material or a UV lacquer, is provided with relief structures. In that case an injection molding tool can be used or the relief structures can be formed by means of shaping using a punch in UV lacquer or by means of a possibly heated punch in thermoplastic material. The use of a conventional photolithographic method for forming the relief structures on the underside of the carrier substrate, in which a photoresist is applied, exposed, developed and used as an etching mask for the underside, is also readily possible.

For a multi-layer body, in particular including an organic electronic component having a carrier substrate comprising a flexible film material, in particular a plastic film material, the object of the invention is attained in that an underside of the carrier substrate is prepared in such a way that in a first region a transparency for a first exposure radiation is produced and in at least one second region a transparency for at least one exposure radiation which is different in relation thereto is produced in register relationship with the first region, and that at least two structured functional layers are arranged in register relationship with each other and also in register relationship with the first and the at least one second region on a top side of the carrier substrate.

In that case the carrier substrate is of a thickness in the range of between 3 μm and 250 μm, preferably between 6 μm and 50 μm.

In this case the first and second exposure radiations can differ for example in respect of their wavelength, polarization, spectral composition, angle of incidence of the illumination, and so forth.

The structural element has particularly good and reproducible optical and/or electrical properties while at the same time requiring a small amount of space, by virtue of the accurate positioning of the functional layers relative to each other.

In a first variant of the process according to the invention the underside of the carrier substrate is prepared by a procedure whereby a first relief structure is formed in the first region and at least one second relief structure different from the first relief structure is formed in the second region and in register relationship with the first relief structure, an exposure mask layer is further applied to the underside, wherein the exposure mask layer is applied with a constant density in relation to surface area with respect to a plane defined by the carrier substrate, the first functional layer applied to the top side of the carrier substrate is structured in register relationship with the first relief structure, and the at least one second electrical functional layer applied to the top side of the carrier substrate is structured in register relationship with the at least one second relief structure. In this embodiment of the invention no exposure mask layer is required.

The first variant of the process is based on the realization that physical properties of the exposure mask layer applied to the carrier substrate, for example effective thickness or optical density, are influenced by the relief structures in the first and at least one second region, so that the transmission properties of the exposure mask layer differ in the first and second regions. The exposure mask layer is used in an exposure process as a mask for partial removal of the first electrical functional layer and also for partial removal of the at least one second electrical functional layer, by a procedure whereby a respective photosensitive layer on the top side of the carrier substrate is exposed through the exposure mask layer—that is to say also through the carrier substrate—and partially removed so that structuring of the first and the second functional layers respectively is directly effected or can be effected thereafter.

That achieves the advantage, over the functional layers applied with conventional processes, that they are oriented in accurate register relationship with each other without additional adjustment complication and expenditure. Only the tolerances of the relief structures have an influence on the tolerances of the position of the two functional layers. The arrangement of regions of the exposure mask layer having identical physical properties is effected precisely in register relationship with the first and at least one second region.

In that respect the carrier substrate is to be selected to be as thin as possible as the spacing between the structured layer and the for example photoactive layer on the opposite side, particularly when using thick carriers, can have an influence on the quality/resolution/register of the functional layer.

The exposure mask layer is a layer which performs a dual function as it affords the function of a highly accurate exposure mask for the production process for differently structured functional layers.

The exposure mask layer is applied to the carrier substrate preferably by means of sputtering, vapor deposition or spraying thereon. In the sputtering procedure, due to the process involved, a directed application of material takes place so that, when sputtering material of the exposure mask layer in a constant density in relation to surface area with respect to the plane defined by the carrier substrate, the material is deposited in locally differing thicknesses on the carrier substrate provided with the relief structures. Vapor deposition and spraying of the exposure mask layer, by virtue of the process technology involved, also preferably entail at least partially directed application of material. In that respect the application of material can be effected not only perpendicularly but also at an angle in the range of between 30 and 150° relative to the plane defined by the carrier substrate. That is advantageous in particular when using periodic symmetrical or asymmetric relief structures which are to be deliberately partially coated.

In that respect the exposure mask layer is preferably formed by a metal layer or by a layer comprising a metal alloy. Such layers can be applied with tried-and-tested processes such as sputtering and they already afford adequate optical density, when small layer thicknesses are involved. The exposure mask layer however can also be a non-metallic layer which for example can be colored, which can contain liquid crystals or which can be doped, for example with nanoparticles or nanospheres to enhance the optical density thereof.

It can further be provided that the exposure mask layer is applied to the carrier substrate in a thickness at which the exposure mask layer is substantially opaque, preferably being of an optical density of greater than 1.5.

It has surprisingly been found that increasing the opacity of the exposure mask layer makes it possible to increase the ratio of the transmissivities of the regions with differing diffractive relief structures. If exposure is effected with a suitable illumination strength through an exposure mask layer usually identified as being opaque (for example optical density of 5), which would normally not be used as a mask layer by virtue of its high optical density, particularly good results can be achieved.

It is particularly advantageous if the exposure mask layer is applied to the carrier substrate over the full surface area involved in a thickness at which the exposure mask layer has an optical density of between 2 and 7. To constitute particularly large differences in the optical density of the first and the second relief structures, a diffractive relief structure with a high depth-to-width ratio of the individual structural elements, in particular with a depth-to-width ratio >0.3, can be shaped as a first relief structure in the first region, and the second relief structure can be in the form of a relief structure with a lower depth-to-width ratio.

Using such special diffractive relief structures, with a suitable choice in respect of the layer thickness of the exposure mask layer, it is possible to generate very great differences which are already perceptible with the eye in the optical densities of the first layer in the first region and the second region. Surprisingly however it was found that such large differences in transmission in the first and the second regions are not necessarily required for implementation of the process according to the invention. The only important consideration is that the first and the at least second region are distinguished by virtue of their transmission properties or a lesser or a greater optical density.

An advantageous configuration provides that the photosensitive layer is exposed through the exposure mask layer by means of UV radiation. Experiments have shown that the differences which can be achieved by the differing configuration of the relief structure in the first and second regions, in the transmission properties of the exposure mask layer, are particularly pronounced in the range of UV radiation. In that way particularly good results can be achieved when using UV radiation for the exposure operation.

Relief structures with slight differences in the depth-to-width ratio also usually have relatively slight differences in transmission, when thin vapor deposition is involved. Even slight relative differences however can be boosted by increasing the layer thickness of the exposure mask layer and therewith the mean optical density. Thus, good results can already be achieved with quite small differences in transmission of the exposure mask layer in the first and second regions. The exposure mask layer can involve a very thin layer of the order of magnitude of a few nm. The exposure mask layer which is applied with a uniform density in relation to surface area with respect to the plane defined by the carrier substrate is considerably thinner in regions with a high depth-to-width ratio than in regions with a lower depth-to-width ratio.

The dimensionless depth-to-width ratio h/d is a characterizing feature in regard to the enlargement of the surface area when using preferably periodic structures, for example of a sine-square configuration. Here the spacing between the highest and the lowest successive points of such a structure is referred to as the depth, that is to say this involves the spacing between a "peak" and a "trough". The spacing between two adjacent highest points, that is to say between two "peaks", is referred as the width. Now, the higher the depth-to-width ratio, the correspondingly steeper are the "peak flanks" and the correspondingly thinner is the first layer deposited on the "peak flanks". The effect of producing a higher level of transmission or transparency upon an increase in the depth-to-width ratio is also observed in relation to structures with vertical flanks, for example rectangular gratings. This however can also involve structures to which this model cannot be applied. For example it can involve discretely distributed line-shaped regions which are only in the form of a "trough", wherein the spacing between two "troughs" is greater my a multiple than the depth of the "troughs". Upon formal application of the above-specified definition, the depth-to-width ratio calculated in that way would be approximately zero and would not reflect the characteristic physical condition. Therefore, in the case of discretely arranged structures which are formed substantially only from a "trough", the depth of the "trough" is to be related to the width of the "trough".

The degree of reduction in optical density can vary in dependence on the substrate, the illumination and so forth. In that respect an important part is played by the absorption of the light in the exposure mask layer.

Table 1 shows the ascertained degree of reflection of exposure mask layers arranged between plastic films (refractive index n=1.5) and comprising metal, in particular Ag, Al, Au, Cr, Cu, Rh and Ti with a light wavelength $\lambda$=550 nm. In that case the thickness ratio $\in$ is formed as a quotient of the thickness t of the metal layer that is required for the degree of reflection R=80% of the maximum $R_{max}$ and the thickness required for the degree of reflection R=20% of the maximum $R_{max}$.

TABLE 1

| Metal | $R_{max}$ | t for 80% $R_{max}$ | t for 20% $R_{max}$ | $\in$ | h/d |
|---|---|---|---|---|---|
| Ag | 0.944 | 31 nm | 9 nm | 3.4 | 1.92 |
| Al | 0.886 | 12 nm | 2.5 nm | 4.8 | 2.82 |
| Au | 0.808 | 40 nm | 12 nm | 3.3 | 1.86 |
| Rh | 0.685 | 18 nm | 4.5 nm | 4.0 | 2.31 |
| Cu | 0.557 | 40 nm | 12 nm | 3.3 | 1.86 |
| Cr | 0.420 | 18 nm | 5 nm | 3.6 | 2.05 |
| Ti | 0.386 | 29 nm | 8.5 nm | 4.4 | 1.86 |

On the basis of heuristic consideration, silver and gold (Ag and Au) as can be seen, have a high maximum degree of reflection $R_{max}$ and require a relatively low depth-to-width ratio to reduce the optical density of the metallic exposure mask layer, in the foregoing example to afford transparency. Aluminum (Al) admittedly has also a high maximum degree of reflection $R_{max}$, but it requires a higher depth-to-width ratio. Preferably therefore it can be provided that the exposure mask layer is made of silver or gold.

Table 2 now shows the calculation results obtained from strict diffraction calculations for relief structures, in the form of linear sinusoidal gratings with a grating spacing of 350 nm, with different depth-to-width ratios. The relief structures are coated with silver with a nominal thickness $t_0$=40 nm. The light incident on the relief structures is of the wavelength $\lambda$=550 nm (green) and is TE polarized and TM polarized respectively.

TABLE 2

| Depth-to-width ratio | Grating spacing in nm | Depth in nm | Degree of reflection (OR) TE | Degree of transparency (OT) TE | Degree of reflection (OR) TM | Degree of transparency (OT) TM |
|---|---|---|---|---|---|---|
| 0 | 350 | 0 | 84.5% | 9.4% | 84.5% | 9.4% |
| 0.3 | 350 | 100 | 78.4% | 11.1% | 50.0% | 21.0% |
| 0.4 | 350 | 150 | 42.0% | 45.0% | 31.0% | 47.0% |
| 1.1 | 350 | 400 | 2.3% | 82.3% | 1.6% | 62.8% |
| 2.3 | 350 | 800 | 1.2% | 88.0% | 0.2% | 77.0% |

As was found, transmission, apart from the depth-to-width ratio, is also dependent on the polarization of the incident light. That dependency is illustrated in Table 2 for the depth-to-width ratio h/d=1.1. It is possible to use that effect for the selective formation of functional layers.

It was further found that the degree of transparency or reflection of the exposure masks is wavelength-dependent. That effect is particularly highly pronounced for TE polarized light.

It was further found that the degree of transparency or transmission decreases if the angle of incidence of the light differs from the normal angle of incidence, that is to say the degree of transparency decreases if the light is not perpendicularly incident. That means that the exposure mask layer can be of a transparent or more transparent nature only in a limited cone of incidence of the light. It can therefore be provided that the exposure mask layer is opaque or non-transmissive when inclined illumination is involved, in which respect that effect is also useful for the selective formation of further functional layers.

Besides the depth-to-width ratio of a relief structure the variation in optical density is also influenced by the spatial frequency of the relief structure. Thus it has further been found that a variation in the transmission characteristics of an exposure mask layer applied to a relief structure can be achieved if the product of spatial frequency and relief depth in a first region of the relief structure is greater than the product of spatial frequency and relief depth in a second region of the relief structure.

The provision of regions involving different transparency or transmission however can also be achieved by other effects, for example by:
  the polarization dependency of transmission as a consequence of differently oriented structures;
  the form factor of the structures, that is to say structures of rectangular, sinusoidal, sawtooth or other profile can have a different transmission characteristic with the same product of spatial frequency and relief depth; and
  directed vapor deposition of the exposure mask layer in combination with special structures or structure combinations or structure arrangements.

If the first relief structure is a structure with a stochastic profile, for example a matt structure, correlation length, roughness depth and statistical distribution of the profile can be typical parameters which influence transmission.

Thus, to produce regions involving different transparency or transmission it is also possible to use in the first region and in the second region, relief structures which differ in one or more of the above-listed parameters.

In a second variant of the process according to the invention the underside of the carrier substrate is prepared by a procedure whereby a first relief structure is formed in the first region and at least one second relief structure different from the first relief structure is formed in the second region and in register relationship with the first relief structure, that the first functional layer applied to the top side of the carrier substrate is structured in register relationship with the first relief structure and the at least one second electrical functional layer applied to the top side of the carrier substrate is structured in register relationship with the at least one second relief structure.

The different exposure properties are afforded here by virtue of the differing diffraction, refraction or reflection of the exposure radiation at the relief structures formed.

In this embodiment the first and second exposure radiations preferably different in respect of their angle of incidence and/or their wavelength. Thus it is possible for example to provide as the first and second relief structures, lens structures, for example cylindrical lenses or free-form lenses which, with differing incidence of the exposure radiation, focus the incident light in the first region or in the second region and thus increase the transparency of the carrier substrate in the first and second regions in dependence on the exposure direction. In addition it is possible to provide diffractive relief structures on the underside of the carrier substrate, which focus the light in dependence on the angle of incidence and/or the wavelength, by diffraction, in different regions. Thus on the one hand it is possible to provide diffractive lenses which in dependence on the wavelength of the incident light involve a different focus and thus focus the light in the first region with a first exposure radiation and focus the light in the second region with a second exposure radiation which differs from the first exposure radiation in its wavelength. In addition it is possible to use blaze gratings which are distinguished by a sawtooth-shaped relief profile. In that case it is possible to select the angle of incidence with respect to the flanks of the sawtooth in such a way that, with a first angle of incidence of the light, total reflection occurs at the flank of the sawtooth (when a special LRI layer (LRI=low refractive index) is applied to the blaze structure) and with a second angle of incidence of the light the light beams are deflected onto the region determined by the angle of refraction. In addition it is possible to provide that there exists at least a significant difference in the transmitted intensity for the two angles of incidence, by means of a suitable selection of the blaze parameters (depth, period, material, etc.).

In addition it is also possible for the first and second relief structures to be provided with an optical separation layer, for example an HRI layer (for example ZnS).

Structured functional layers of very high resolution can be achieved by means of the first and second variants of the process. The resolution and register relationship which can be achieved are better approximately by a factor of 100 than can be attained by known structuring processes. As the width of the structure elements of the first relief structure can be in the range of the wavelength of visible light (between about 380 and 780 nm) but also therebelow, it is possible to produce functional layer regions involving very fine contours. Accordingly major advantages are also achieved in that respect in comparison with the previously known processes as it is possible to effect further miniaturization of the component.

It is possible to produce lines and/or points with a high level of resolution, for example of a width or a diameter respectively of less than 5 μm, in particular to about 200 nm. Preferably levels of resolution in the range of between about 0.5 μm and 5 μm, in particular in the region of about 1 μm, are produced. In comparison, line widths of less than 10 μm can be achieved only with a very high level of complication and expenditure using processes which provide for adjustment of the structured functional layers in respect of register.

It is preferred if the first and/or the at least one second relief structure are in the form of diffractive relief structures. In that respect it has proven desirable if the first and the at least one second relief structures differ in their azimuth.

The first and/or the at least one second relief structure are in the form in particular of a grating structure such as a linear grating or a cross grating, an isotropic or an anisotropic matt structure, a binary or continuous Fresnel lens, a microprism, a blaze grating, a combination structure or a macrostructure:
  linear gratings: for example sine gratings with a number of lines of between 100 l/mm and 5,000 l/mm and structure depths of between 50 nm and 5 μm;

cross gratings: for example sine gratings with a number of lines of between 100 l/mm and 5,000 l/mm and structure depths of between 50 nm and 5 μm;

matt structures (isotropic/anisotropic): correlation lengths of between 0.5 μm and 50 μm and structure depths of between 50 nm and 10 μm;

blaze gratings or microprisms: numbers of lines of between 10 l/mm and 3,000 l/mm and structure depths of between 25 nm and 10 μm;

macrostructure: surface structures of any form, characterized by a maximum depth of between 100 nm and 10 μm, with great distances (>100 μm) between discontinuities in the surface profile;

combination structures: arise out of the combinations of the aforementioned structures.

In accordance with a third variant of the process according to the invention the underside of the carrier substrate is prepared by a procedure whereby a first color layer is arranged in the first region and at least one second color layer different in color from the first color layer is arranged in the second region and in register relationship with the first color layer, and the first functional layer applied to the top side of the carrier substrate is structured in register relationship with the first color layer and the at least one second functional layer applied to the top side of the carrier substrate is structured in register relationship with the at least one second color layer. In that case the different color layers act as filters for exposure radiations of differing wavelengths.

In that case for example a red color layer is applied by printing in pattern form in the first region, the red color layer being transparent for a blue first exposure radiation, and a blue color layer is applied by printing in a second region, the blue color layer being transparent for a red second exposure radiation. Regions of the carrier substrate which are free of the first and second color layers allow both exposure radiations to pass through while regions which are covered with both color layers do not allow either of the two exposure radiations to pass through.

In accordance with the first, second or third variant the first functional layer is preferably applied to the top side of the carrier substrate over the full surface area involved, wherein a first photosensitive layer is formed on the top side over the full surface area prior to or after formation of the first functional layer. Thereafter exposure of the first photosensitive layer is effected by means of the first exposure radiation through the carrier substrate and optionally through the exposure mask layer which is/are transparent for the first exposure radiation in the first region, and the first photosensitive layer is partially removed in register relationship with the first region, structuring of the first functional layer being effected immediately or subsequently. In addition the at least one second functional layer is applied to the top side over the full surface area involved, wherein at least one second photosensitive layer is formed on the top side over the full surface area involved prior to or after the formation of the at least one second functional layer. Exposure of the at least one second photosensitive layer is now effected by means of at least the second exposure radiation through the carrier substrate and optionally through the exposure mask layer which is/are transparent in the second region for the second exposure radiation and the at least one second photosensitive layer is partially removed in register relationship with the second region, structuring of the at least one second functional layer being effected immediately or subsequently.

It has proven desirable if the underside of the carrier substrate is prepared in a third region in such a way that the third region is transparent both for the first and also for the at least one second exposure radiation. In that way regions of the structured first and the at least one structured second functional layer can be arranged in superposed coincident relationship. In the case of the first and second variant with relief structures, the different relief structures are formed in the third region in mutually juxtaposed relationship or in mutually superposed relationship. In the case of the third variant no color layers are arranged in the third region.

It has further proven desirable if the underside of the carrier substrate is prepared in a fourth region in such a way that the fourth region is opaque for the first and the at least one second exposure radiation. In the case of the first and second variants with relief structures, no or selected relief structures are formed in the third region. In the case of the third variant all color layers are arranged in the third region.

Accordingly it is possible to implement at least four different exposure states:
a) exposure only in the first region;
b) exposure only in the at least one second region;
c) exposure in the first and in the at least one second region;
d) non-exposure.

It has proven desirable if the unprepared carrier substrate is made from a material and/or of a thickness such that it is transparent for the first and/or the at least one second exposure radiation. The unprepared carrier substrate however can also be such that it is opaque for the first and/or the at least one second exposure radiation and only becomes at least partially transparent for the exposure radiation by the preparation procedure, for example by the introduction of relief structures, or upon exposure, for example due to chemical reactions and so forth.

It has proven desirable if the first and the at least one second exposure radiation differ in their wavelength and/or their polarization and/or their impingement angles on the plane defined by the carrier substrate.

Thus, the third variant of the process according to the invention involves using in particular exposure radiations of differing wavelength, for example red radiation as the first exposure radiation and blue radiation as the at least one second exposure radiation in combination with a blue and a red color layer and the first and second color layers.

At least one third functional layer can be provided over the full surface area or in partially interrupted fashion between the structured first functional layer and the at least one structured second functional layer. In that respect it has proven desirable if the at least one third functional layer is formed from a semiconducting or an electrically insulating functional layer material.

In general terms functional layers like also the carrier substrate which are between the radiation source and a photosensitive layer in the beam path must afford a minimum transparency for the respective exposure radiation so that partial exposure of the photosensitive layer can be effected. In that respect it is not just the visual impression (opaque-transparent) that is decisive, but only the transmission of the respective layer.

Preferably the first functional layer is formed from an electrically conducting functional layer material to form in particular conductor tracks and/or electrode surfaces.

Depending on the respective requirement of the component formed, the structured second functional layer is formed from an electrically conducting or a semiconducting or a dielectric functional layer material.

In general terms electrically conducting functional layers can be galvanically reinforced in an intermediate step to increase electrical conductivity.

Furthermore, for the three variants, it has proven desirable if at least one photosensitive layer is used as the electrical functional layer. In accordance with its structuring the photosensitive layer can form for example an electrically conducting layer, a semiconducting layer or a dielectric layer. Furthermore at least one photosensitive layer can be removed during or after implementation of the process.

It is preferable if a photosensitive wax lacquer layer or a positive or negative photoresist layer or a photopolymer layer is used as the photosensitive layer. Positive photoresists can be removed in the exposed region and negative photoresists in the unexposed region. A photosensitive layer which is activated by the exposure operation and which in the actuated regions forms an etching agent for the first and/or the at least one second functional layer has also proven desirable.

Preferably a capacitor is formed as the electronic component, in which case the first functional layer is electrically conducting and is structured in the form of two capacitor electrodes and the at least one second functional layer is in the form of a structured dielectric layer.

It is further preferred if a field effect transistor, in particular an OFET, is in the form of the electronic component, the first functional layer being electrically conducting and being structured in the form of source/drain electrodes, a second functional layer being electrically conducting and structured in the form of a gate electrode, or vice-versa, and wherein formed between the first and the at least one second functional layer over the full surface area are a third functional layer comprising a semiconductor layer and over the full surface area a fourth functional layer comprising a dielectric layer. In that case it is possible therefore to adopt a top gate or a bottom gate structure.

The field effect transistor is formed in particular by a procedure whereby a photosensitive wax lacquer layer is applied over the full surface area to the top side of the carrier substrate, a first functional layer is formed thereon over the full surface area, exposure with the first exposure radiation is now effected, in which case the wax lacquer layer becomes insoluble in the first region, the wax lacquer layer inclusive of the first functional layer is washed off in the other regions and the first functional layer is structured, then the third and the first functional layers are formed, in addition the second functional layer and thereon a photoresist layer are applied over the full surface area, exposure with the second exposure radiation is now effected and the photoresist layer is structured in register relationship with the second region, and etching and structuring of the second functional layer is effected using the structured photoresist layer as an etching mask.

Alternatively the field effect transistor can be formed by a procedure whereby the first functional layer is formed over the full surface area involved on the top side of the carrier substrate and a first photoresist layer is applied over the full surface area, exposure is now effected with the first exposure radiation, the first photoresist layer is structured in register relationship with the first region and is used as an etching mask for etching and structuring of the first functional layer, the etching mask is removed, then the third functional layer and the fourth functional layer are formed, in addition the second functional layer and thereon a second photoresist layer are applied over the full surface area, exposure is now effected with the second exposure radiation and the second photoresist layer is structured in register relationship with the second region, and etching and structuring of the second functional layer are effected using the structured second photoresist layer as an etching mask.

It has proven particularly desirable if an organic electrical component containing at least one organic functional layer is formed.

The organic functional layer is preferably applied from a liquid, in particular by printing or application by means of a doctor. Organic functional layer materials can be inter alia polymers which are dissolved in the liquid. The liquid containing the organic functional layer materials can also be a suspension or an emulsion.

An organic electrical functional layer can include all kinds of substances with the exception of the classic semiconductors (crystalline silicon or germanium) and the typical metallic conductors. Accordingly there is no restriction in a dogmatic sense to organic material in the sense of carbon chemistry. Here the term polymer expressly includes polymeric material and/or oligomeric material and/or material comprising "small molecules" and/or material comprising "nanoparticles". Layers of nanoparticles can be applied for example by means of a polymer suspension. Therefore the polymer can also be a hybrid material for example to produce an n-conducting polymeric semiconductor. Rather, by way of example silicones are also included. Furthermore the term is not to be restricted in respect of the molecule size but, as stated hereinbefore, is intended also to include "small molecules" or "nanoparticles". It can be provided that the organic functional layer is formed with different organic material.

Pentacene, polyalkylthiophene etc. can be provided as p-conducting organic semiconductor materials, and for example soluble fullerene derivatives can be provided as n-conducting organic semiconductor materials.

Preferably at least two electronic components are formed on the carrier substrate. They can also be provided in mutually connected relationship as a constituent part of an electronic circuit.

In particular the carrier substrate is formed from an inexpensive flexible film material, in particular a transparent plastic film material, of a layer thickness in the range of between 3 $\mu$m and 150 $\mu$m. In that respect films of PET, PC, PEN are particularly preferred. It is however also possible to use rigid carrier substrates, for example of glass.

It is particularly preferable if the carrier substrate is in the form of a strip and is processed in a continuous roll-to-roll process. In that case the carrier substrate is provided wound up on a supply roll, it is withdrawn therefrom, and, in the process according to the invention, it is coated with the functional layers of the at least one electrical component and finally wound up again onto a further supply roll or divided into individual components, component groups or circuits, in particular by stamping.

In a further configuration the carrier substrate can be adapted to be releasable from the electrical functional layers of the component. For that purpose in particular a release layer is provided between the carrier substrate and the electrical functional layers of the at least one electrical component. A component or a component group can be fixed on a separate carrier by means of an adhesive layer arranged on the side of the component in opposite relationship to the carrier substrate, and then the carrier substrate can be pulled off. In that case processing can be effected by means of methods known for transfer films. In that respect the functional layers inclusive of the adhesive layer function as a transfer layer arrangement.

An electronic component according to the invention or the structured functional layers thereof can involve a distortion in the range of between 0 and 10%, by virtue of the small thickness of the carrier substrate. In that case the distortion is calculated from the deviation in shape of the structured functional layer, in regard to its ideal form.

The electronic component formed is particularly flexibly adapted to the contour of a piece of equipment or the like so that in particular use is possible for RFID tags, on packaging material, labels or the like.

The electronic component is preferably in the form of a capacitor, a field effect transistor, in particular an OFET, an LED, in particular an OLED or a diode.

The formation of electronic circuits, in particular organic electronic circuits, with at least one electronic component according to the invention, is ideal. In that respect the circuit can also be so designed that it flexibly adapts to the contour of a piece of equipment or the like.

BRIEF DESCRIPTION OF THE DRAWINGS

FIGS. 1a through 2f are intended to illustrate the process according to the invention by way of example. In the drawing:

FIG. 1a shows a prepared underside of the carrier substrate,

FIG. 2f shows a plan view of the carrier substrate of FIG. 2e after removal of the second photoresist layer.

DETAILED DESCRIPTION OF THE INVENTION

Figure 1A:
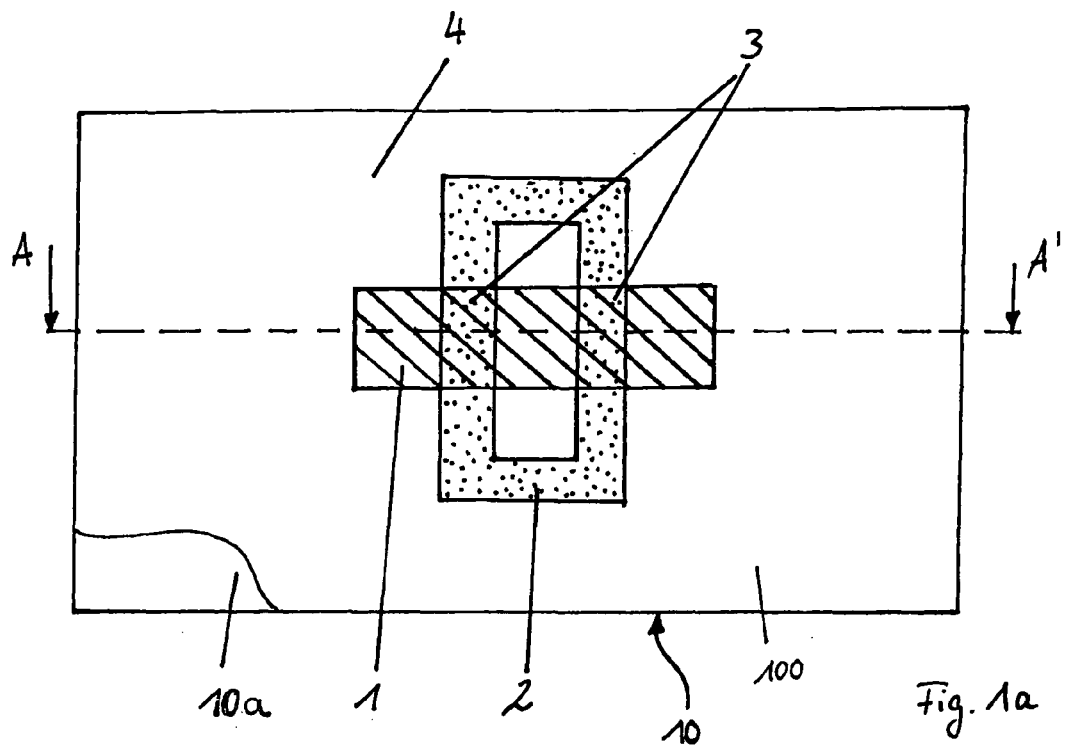
Figure 1B:
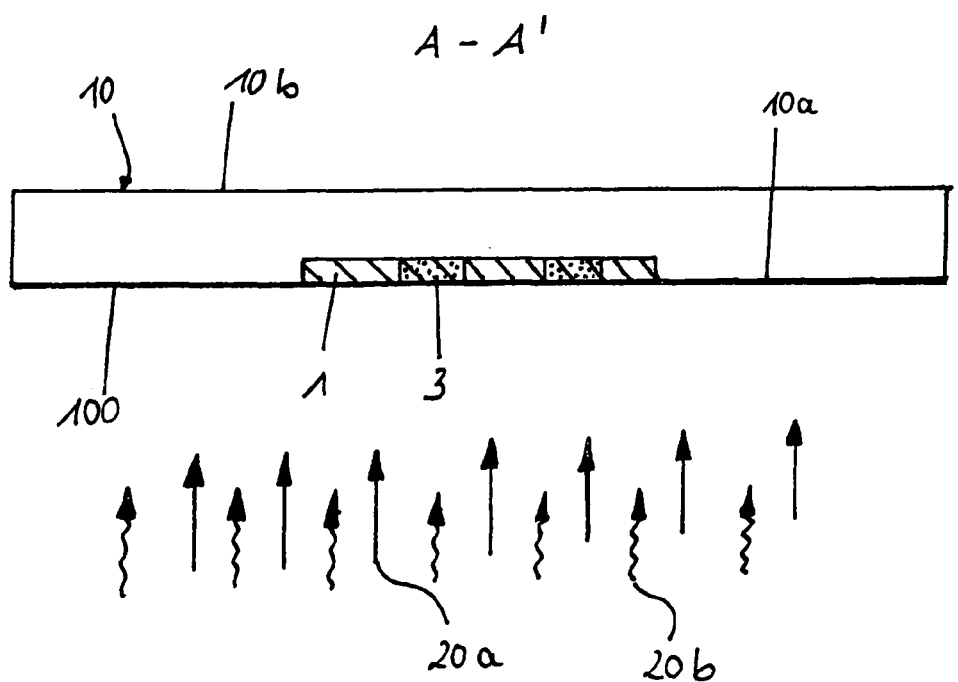
FIG. 1b shows the carrier substrate of FIG. 1 in section on A-A'.

FIG. 1a shows a carrier substrate 10 of transparent PET, which has a prepared underside 10a. FIG. 1b shows the carrier substrate 10 of FIG. 1a in section on A-A'. The top side of the carrier substrate 10 is identified by reference 10b. The underside 10a is provided with a first diffractive relief structure in a first region 1 and with a second diffractive relief structure in a second region 2. For that purpose, as already explained above, the first and second relief structures are formed directly in the underside 10a of the carrier substrate or the first and second relief structures are shaped in a replication lacquer layer provided on the underside. The first and second relief structures involve for example in each case sine gratings with a relief depth of 400 nm and a grating period of 350 nm, wherein the grating lines of the sine grating of the first relief structure are arranged substantially perpendicularly with respect to the grating lines of the sine grating of the second relief structure. As can be seen from Table 2 such sine gratings involve a degree of transparency of 82.3% for the TE polarization direction and 62.8% for the TM polarization direction. Accordingly, upon illumination of the first and second relief structures, the result is a relative transparency difference of 30% for the two different polarization directions.

In addition it is also possible to use, for the first and second relief structures, different diffraction structures with a grating period of less than the wavelength of the light used for the radiation, in respect of which the azimuth angle of the first and second relief structures differs and the depth-to-width ratio of the relief structure is preferably greater than 0.3. In particular it is possible here to use the relief structures listed by way of example in Table 2, with a grating period of 350 nm and a depth of 100 nm or 800 nm, in which case preferably the azimuth angle of the first and second relief structures involves an angle difference of about 90°.

A coating mask layer 100 of silver is sputtered onto the first and second relief structures over the full surface area involved, in a constant density in relation to surface area, with respect to the plane defined by the carrier substrate 10.

The first region 1 is thus more transparent than the second region, for TE-polarized light, oriented in accordance with the grating lines of the first relief structure. Conversely the second region is more transmissive than the first region, for light which is polarized at 90° relative thereto. In the third region involving superpositioning of the first and second relief structures (here a cross-shaped sine grating of a depth of 400 nm and with a grating period of 350 nm), the higher transparency exists for polarization directions. If therefore exposure with linearly polarized light of a wavelength $\lambda=550$ nm is selected as the first exposure radiation 20a, the polarization direction of which is so selected that the light is TE-polarized in relation to the first relief structure, then there is a higher degree of transparency for the first exposure radiation 20a in the first and third regions. For a second exposure radiation 20b which involves an exposure with linearly polarized light of a wavelength of 550 nm and with a polarization direction which is turned through 90° relative to the polarization direction of the exposure radiation 20a, that involves increased transparency in the second region 2 and the third region 3. In a fourth region 4 without relief structure the exposure mask layer 100 is opaque and is present in a layer thickness so that the fourth region 4 is opaque for the first and second exposure radiations 20a, 20b.

Figure 1C:
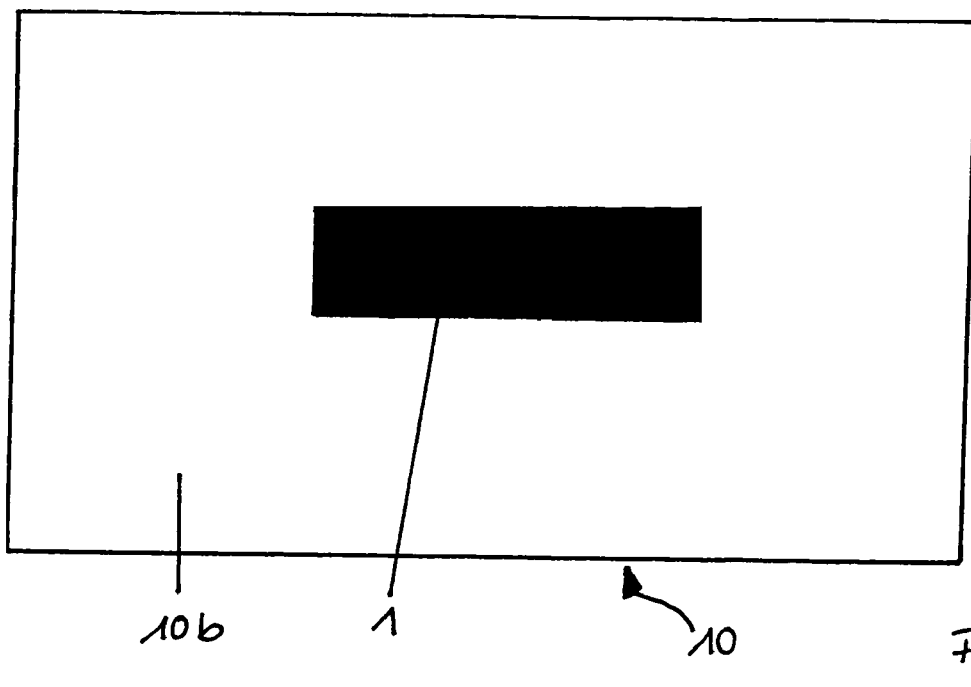
FIG. 1c shows the top side of the carrier substrate of FIG. 1a upon exposure with a first exposure radiation.

FIG. 1c shows the top side 10b of the carrier substrate 10 of FIG. 1a upon exposure of the underside 10a with the first exposure radiation 20a. In the first region 1 the exposure mask layer 100 has on its underside 10a increased transparency for the first exposure radiation 20a.

Figure 1D:
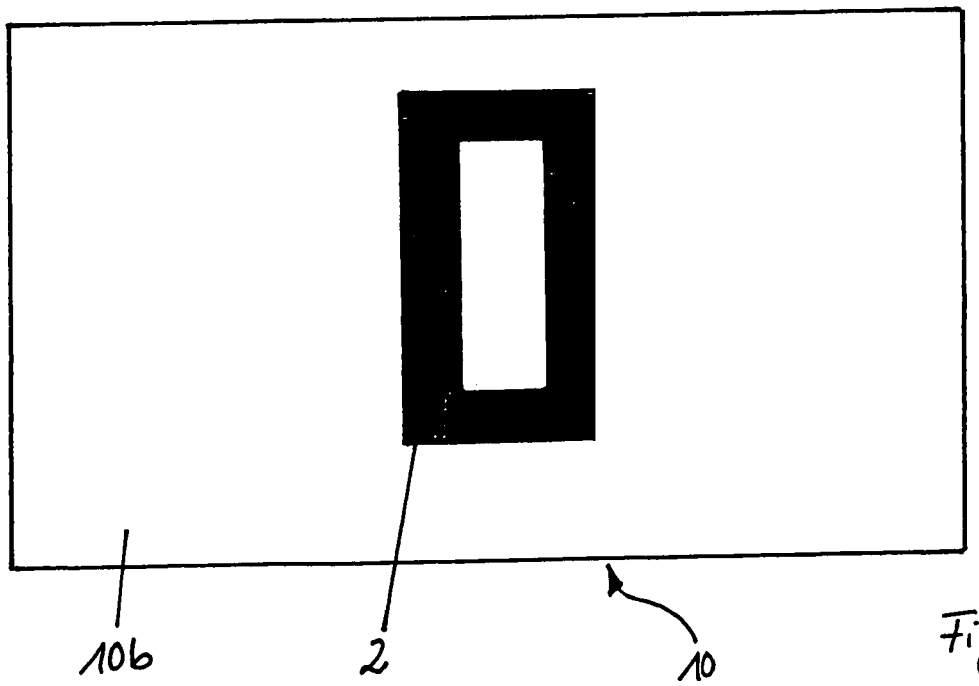
FIG. 1d shows the top side of the carrier substrate of FIG. 1a upon exposure with a second exposure radiation.

FIG. 1d shows the top side 10b of the carrier substrate 10 of FIG. 1a upon exposure of the underside 10a with the second exposure radiation 20b. It is only in the second region 2 that the exposure mask layer 100 has on its underside 10a increased transparency for the second exposure radiation 20b.

Figure 2A:
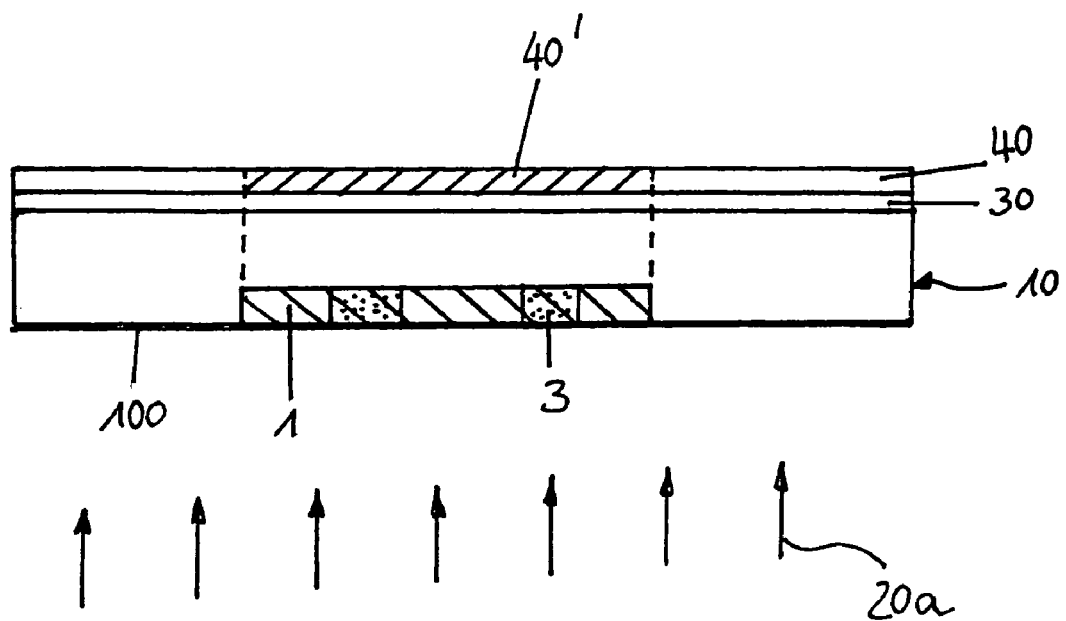
FIG. 2a shows the carrier substrate of FIG. 1 in section on A-A' with applied first functional layer and first negative photoresist layer.

FIG. 2a shows the carrier substrate 10 of FIG. 1a in section on A-A' with the first functional layer 30 applied thereto over the full surface area, consisting of copper, with a layer thickness of between 0.1 μm and 0.5 μm, and also a first negative photoresist layer 40 applied over the full surface area involved. From the underside 10a of the carrier substrate 10 the first exposure radiation 20a penetrates to an increased degree in the first region 1 through the exposure mask layer 100, the carrier layer 10 and the first functional layer 30 and leads to partially greater exposure of the first photoresist layer 40. In this case the exposure duration and the exposure strength are matched to the photoresist used for the photoresist layer 40 so that the photoresist is activated in the partially more greatly exposed region 1, but is not activated in the less exposed regions 2 and 4.

The activated photoresist regions 40' remain on the first functional layer 30 upon development and structuring of the photoresist and form an etching mask for the first functional layer 30.

Figure 2B:
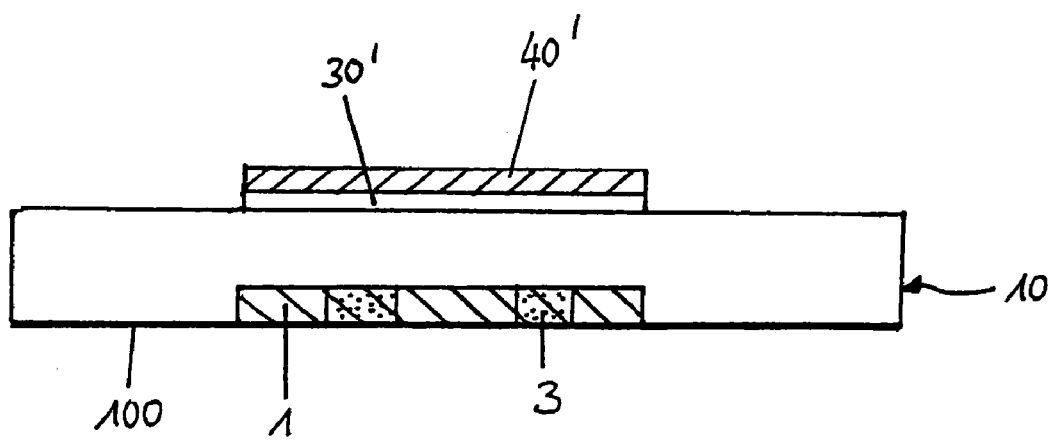
FIG. 2b shows the carrier substrate of FIG. 2a after structuring of the photoresist layer and etching of the first functional layer.

FIG. 2b shows the carrier substrate 10 of FIG. 2a after etching of the first functional layer 30. The regions of the first functional layer 30 which were not covered by the etching mask are removed so that a structured first functional layer 30' was formed.

Figure 2C:
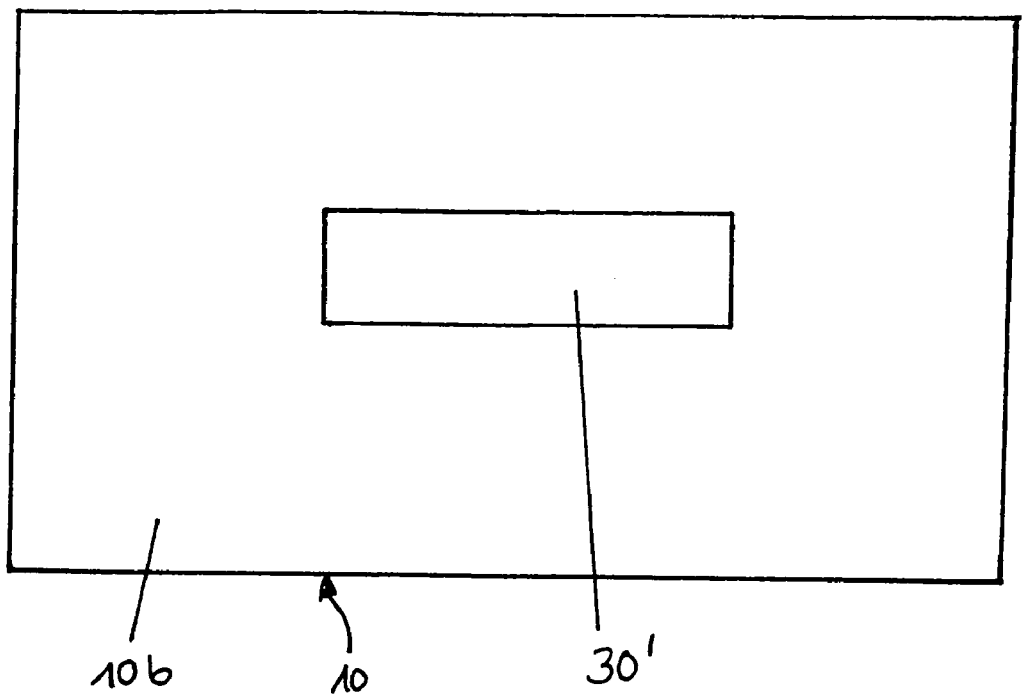
FIG. 2c shows a plan view of the carrier substrate of FIG. 2a after removal of the first photoresist layer.

FIG. 2c shows a plan view of the carrier substrate 10 of FIG. 2b after removal of the etching mask. The structured first functional layer 30' is present on the top side 10a of the carrier substrate 10 in register relationship with the first region 1 (see FIG. 1c).

Figure 2D:
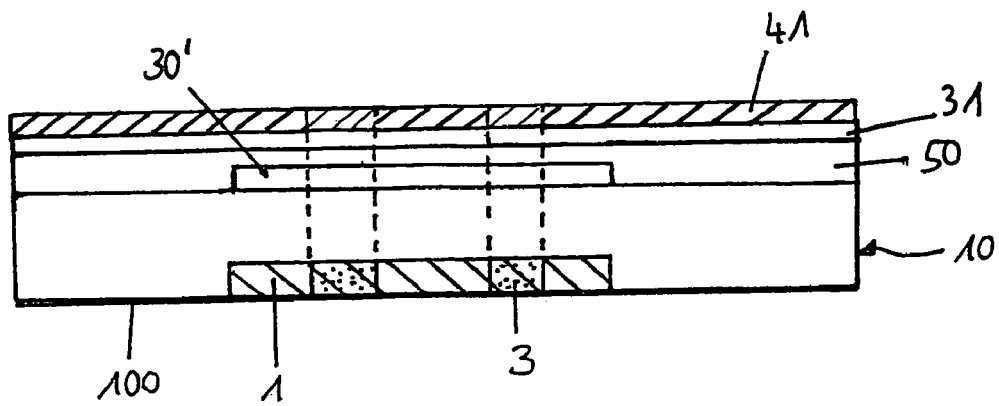
FIG. 2d shows the carrier substrate of FIG. 2c with applied second functional layer and second positive photoresist layer.

FIG. 2d shows a cross-section of the carrier substrate 10 of FIG. 2c, with a third functional layer 50 of a transparent organic dielectric material, which is applied over the full surface area to the structured first functional layer 30' and regions of the carrier substrate 10, that are free therefrom. A second functional layer 31 of copper is applied thereto over the full surface area in a layer thickness of between 0.1 μm and 0.5 μm and a second positive photoresist layer 41 is also applied thereto over the full surface area. From the underside 10a of the carrier substrate 10 the second exposure radiation 20b penetrates to an increased extent in the second region 2 through the exposure mask layer 100, the carrier layer 10, the first functional layer 30, the third functional layer 50 and the second functional layer 31 and leads to partially greater exposure of the second photoresist layer 41. In that case the exposure duration and the exposure strength are matched to the photoresist used for the photoresist layer 41 so that the photoresist is activated in the partially more greatly exposed region 2 but is not activated in the less exposed regions 1 and 4.

The non-activated photoresist regions 41' remain on the second functional layer 31 upon development and structuring of the positive photoresist and form an etching mask for the second functional layer 31.

Figure 2E:
FIG. 2e shows the carrier substrate of FIG. 2d after structuring of the second photoresist layer and etching of the second functional layer.
Figure 2E:
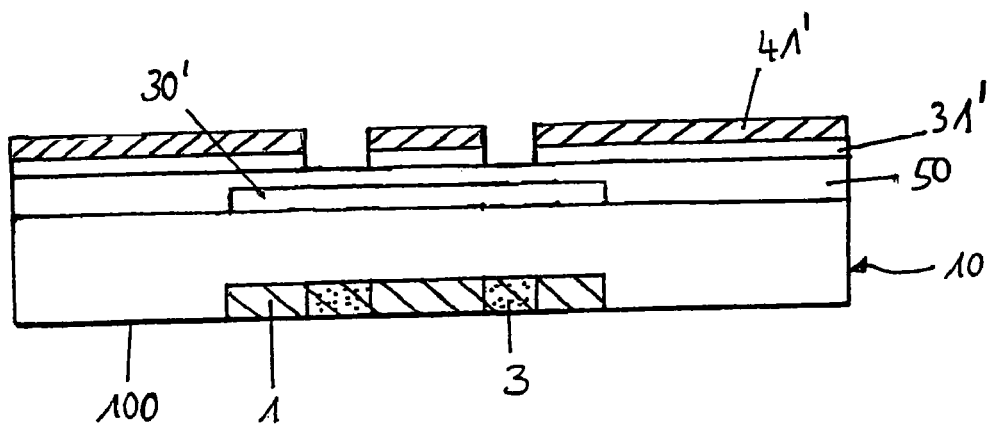

FIG. 2e shows the carrier substrate 10 of FIG. 2d after development and structuring of the second photoresist layer or the remaining unexposed regions 41' thereof and after etching of the second functional layer 31, in which case the structured second functional layer 31' was formed.

Figure 2F:
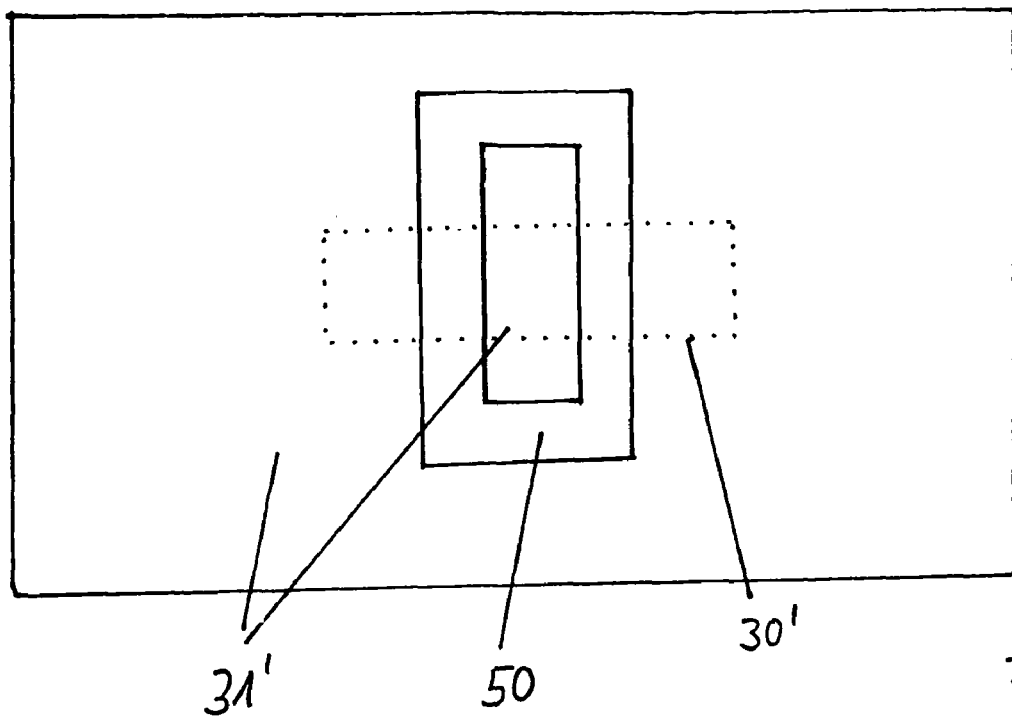

FIG. 2f shows a plan view of the carrier substrate 10 of FIG. 2e after removal of the structured second photoresist layer 41'. It is possible to see the structured second functional layer 31' on the third functional layer 50. The position of the structured first functional layer 30' under the third functional layer 50 is indicated by a dotted line. The structured first functional layer 30' is arranged in perfect register relationship with the structured second functional layer 31'.

The invention claimed is:

1. A process for the production of a multi-layer body having at least one electronic component, wherein the multi-layer body includes at least two electrical functional layers, on a top side of a carrier substrate, which are structured in register relationship with each other, wherein
an underside of the carrier substrate is prepared in such a way that in a first region the result is a transparency which is increased in relation to at least one second region for a first exposure radiation and in the at least one second region the result is a transparency which is increased in relation to the first region for at least one second exposure radiation which is different in relation thereto in register relationship with the first region, the underside is successively exposed with the first and the at least one second exposure radiation and the first exposure radiation is used for structuring a first functional layer and the at least one second exposure radiation is used for structuring at least one second functional layer on the top side of the carrier substrate.

2. A process as set forth in claim 1, wherein the underside of the carrier substrate is prepared by a procedure whereby a first relief structure is formed in the first region and at least one second relief structure different from the first relief structure is formed in the second region and in register relationship with the first relief structure, an exposure mask layer is further applied to the underside, wherein the exposure mask layer is applied with a constant density in relation to surface area with respect to a plane defined by the carrier substrate, the first functional layer applied to the top side of the carrier substrate is structured in register relationship with the first relief structure, and the at least one second electrical functional layer applied to the top side of the carrier substrate is structured in register relationship with the at least one second relief structure.

3. A process as set forth in claim 2, wherein in that the exposure mask layer is formed by a metal layer or a layer of a metal alloy.

4. A process as set forth in claim 1, wherein the first and second relief structures are formed by diffractive relief structures with a depth-to-width ratio of the individual structure elements of ≧0.3.

5. A process as set forth in claim 1, wherein the first and second relief structures are formed by relief structures with a grating period ≦800 nm.

6. A process as set forth in claim 1, wherein the first and second relief structures differ in their azimuth by about 90°.

7. A process as set forth in claim 1, wherein the underside of the carrier substrate is prepared by a procedure whereby a first relief structure is formed in the first region and at least one second relief structure different from the first relief structure is formed in the second region and in register relationship with the first relief structure, and wherein the first functional layer applied to the top side of the carrier substrate is structured in register relationship with the first relief structure and the at least one second electrical functional layer applied to the top side of the carrier substrate is structured in register relationship with the at least one second relief structure.

8. A process as set forth in claim 2, wherein the first and/or the at least one second relief structure are in the form of diffractive relief structures.

9. A process as set forth in claim 2, wherein the first and the at least one second relief structure differ in their azimuth.

10. A process as set forth in claim 2, wherein the first and/or the at least one second relief structure is in the form of a grating structure, an isotropic or an anisotropic matt structure, a binary or continuous Fresnel lens, a microprism, a blaze grating, a combination structure or a macrostructure.

11. A process as set forth in claim 1, wherein the underside of the carrier substrate is prepared by a procedure whereby a first color layer is arranged in the first region and at least one second color layer different in color from the first color layer is arranged in the second region and in register relationship with the first color layer, and the first functional layer applied to the top side of the carrier substrate is structured in register relationship with the first color layer and the at least one second functional layer applied to the top side of the carrier substrate is structured in register relationship with the at least one second color layer.

12. A process as set forth in claim 1, wherein the first functional layer is applied to the top side over the full surface area, and wherein prior to or after the formation of the first functional layer, a first photosensitive layer is applied on the top side over the full surface area, exposure of the first photosensitive layer is effected by means of the first exposure radiation through the carrier substrate, the first photosensitive layer is partially removed in register relationship with the first region, wherein structuring of the first functional layer is effected immediately or subsequently, and wherein in addition, the at least one second functional layer is applied to the top side over the full surface area, prior to or after the formation of the at least one second functional layer at least one second photosensitive layer is formed on the top side over the full surface area, exposure of the at least one second photosensitive layer is effected by means of at least the second exposure radiation through the carrier substrate, the at least one second photosensitive layer is partially removed in register relationship with the second region, wherein structuring of the at least one second functional layer is effected immediately or subsequently.

13. A process as set forth in claim 1, wherein the underside of the carrier substrate is prepared in a third region in such a way that the transparency of the third region is increased both for the first and also for the at least one second exposure radiation.

14. A process as set forth in claim 1, wherein the underside of the carrier substrate is prepared in a fourth region in such a way that the fourth region is opaque for the first and the at least one second exposure radiation.

15. A process as set forth in claim 1, wherein the unprepared carrier substrate is formed from a material and/or in a thickness so that it is transparent for the first and/or the at least one second exposure radiation.

16. A process as set forth in claim 1, wherein the first and the at least one second exposure radiation differ in their wavelength.

17. A process as set forth in claim 1, wherein the first and the at least one second exposure radiation differ in their polarization.

18. A process as set forth in claim 1, wherein the first and the at least one second exposure radiation are incident at different angles on the plane defined by the carrier substrate.

19. A process as set forth in claim 2, wherein the exposure mask layer is applied, by sputtering, to the carrier substrate at an angle in the range of between 30 and 150° relative to the plane defined by the carrier substrate.

20. A process as set forth in claim 1, wherein at least one third functional layer is provided over the full surface area between the structured first and the at least one structured second functional layer.

21. A process as set forth in claim 20, wherein the at least one third functional layer is formed from a semiconducting or an electrically insulating functional layer material.

22. A process as set forth in claim 1, wherein the structured first functional layer is formed from an electrically conducting functional layer material.

23. A process as set forth in claim 1, wherein the structured second functional layer is formed from an electrically conducting or a semiconducting or a dielectric functional layer material.

24. A process as set forth in claim 22, wherein at least one electrically conducting functional layer is galvanically reinforced.

25. A process as set forth in claim 12, wherein at least one photosensitive layer is used as an electrical functional layer.

26. A process as set forth in claim 12, wherein at least one photosensitive layer is removed during or after implementation of the process.

27. A process as set forth in claim 12, wherein a photosensitive wax lacquer layer or a photoresist layer or a photopolymer layer is used as the photosensitive layer.

28. A process as set forth in claim 12, wherein the photosensitive layer is activated by the exposure and the activated photosensitive layer forms an etching means for the first and/or at least one second functional layer.

29. A process as set forth in claim 1, wherein a capacitor is provided as the electronic component, the first functional layer is electrically conducting and is structured in the form of two capacitor electrodes and the at least one second functional layer is in the form of a structured dielectric layer.

30. A process as set forth in claim 1, wherein a field effect transistor is provided as the electronic component, the first functional layer is electrically conducting and is structured in the form of source/drain electrodes, a second functional layer is electrically conducting and is structured in the form of a gate electrode, or conversely, and wherein that a third functional layer comprising a semiconducting layer is formed over the full surface area and a fourth functional layer comprising a dielectric layer is formed over the full surface area between the first and the at least one second functional layer.

31. A process as set forth in claim 30, wherein the field effect transistor is formed by a procedure whereby a photosensitive wax lacquer layer is applied over the full surface area to the top side of the carrier substrate, the first functional layer is formed thereon over the full surface area, exposure with the first exposure radiation is now effected, in which case the wax lacquer layer becomes insoluble in the first region, the wax lacquer layer inclusive of the first functional layer is washed off in the other regions and the first functional layer is structured, then the third and the first functional layers are formed, in addition the second functional layer and thereon a photoresist layer are applied over the full surface area, exposure with the second exposure radiation is now effected and the photoresist layer is structured in register relationship with the second region, and etching and structuring of the second functional layer is effected using the structured photoresist layer as an etching mask.

32. A process as set forth in claim 30, wherein the field effect transistor is formed by a procedure whereby the first functional layer is formed over the full surface area involved on the top side of the carrier substrate and a first photoresist layer is applied over the full surface area, exposure is now effected with the first exposure radiation, the first photoresist layer is structured in register relationship with the first region and is used as an etching mask for etching and structuring of the first functional layer, the etching mask is removed, then the third functional layer and the fourth functional layer are formed, in addition the second functional layer and thereon a second photoresist layer are applied over the full surface area, exposure is now effected with the second exposure radiation and the second photoresist layer is structured in register relationship with the second region, and etching and structuring of the second functional layer are effected using the structured second photoresist layer as an etching mask.

33. A process as set forth in claim 1, wherein an organic component including at least one organic functional layer is formed.

34. A process as set forth in claim 1, wherein at least two electronic components are formed on the carrier substrate.

35. A process as set forth in claim 33, wherein the at least two electronic components are in the form of a constituent part of an electrical circuit.

36. A process as set forth in claim 1, wherein the carrier substrate is formed from a flexible transparent plastic film material, of a layer thickness in the range of between 3 and 250 μm.

37. A process as set forth in claim 1, wherein the carrier substrate is in strip form and is processed in a continuous roll-to-roll process.

38. A process as set forth in claim 1, wherein carrier substrate is adapted to be releasable from the electrical functional layers of the component.

* * * * *